(12) United States Patent
Mallinson (10) Patent No.: US 9,209,806 B2
(45) Date of Patent: Dec. 8, 2015

(54) DELAY CIRCUIT INDEPENDENT OF SUPPLY VOLTAGE

(71) Applicant: ESS Technology, Inc., Fremont, CA (US)

(72) Inventor: A. Martin Mallinson, Kelowna (CA)

(73) Assignee: ESS Technology, Inc., Milpitas, CA (US)

(*) Notice: Subject to any disclaimer, the term of this patent is extended or adjusted under 35 U.S.C. 154(b) by 0 days.

(21) Appl. No.: 14/314,882

(22) Filed: Jun. 25, 2014

(65) Prior Publication Data

US 2014/0375356 A1    Dec. 25, 2014

Related U.S. Application Data

(60) Provisional application No. 61/839,309, filed on Jun. 25, 2013.

(51) Int. Cl.
| | |
|---|---|
| *H03K 19/003* | (2006.01) |
| *H03K 19/0185* | (2006.01) |
| *H03K 5/13* | (2014.01) |
| *H03K 5/14* | (2014.01) |

(52) U.S. Cl.
CPC .......... *H03K 19/00315* (2013.01); *H03K 5/133* (2013.01); *H03K 5/14* (2013.01); *H03K 19/018521* (2013.01)

(58) Field of Classification Search
CPC ............. H03K 19/0948; H03K 19/018521; H03K 19/00315; H03K 3/012; H03K 3/356139; H03K 19/017545; H03K 19/018585; H03K 5/131; H03K 3/55; H03K 3/543; H03K 3/537; H03K 3/78; H03K 17/28; H03K 17/288; H03K 17/292; H03K 5/13; H03K 3/35; H03K 4/94; H03K 5/15033; H03B 2200/0062; B12K 11/248; G04F 10/04
USPC ........ 326/81, 83, 86, 103; 327/312, 410, 534; 716/119
See application file for complete search history.

(56) References Cited

U.S. PATENT DOCUMENTS

| | | | |
|---|---|---|---|
| 4,563,594 A | 1/1986 | Koyama | |
| 5,175,445 A | 12/1992 | Kinugasa et al. | |
| 6,300,819 B1 * | 10/2001 | De et al. | 327/534 |
| 6,526,552 B1 * | 2/2003 | Bosnyak et al. | 327/312 |
| 6,646,488 B2 | 11/2003 | Ajit | |
| 6,900,711 B2 * | 5/2005 | Vice | 333/262 |
| 7,212,062 B2 * | 5/2007 | Sperling et al. | 327/410 |
| 7,355,489 B2 * | 4/2008 | Maheshwari | 331/109 |
| 7,521,976 B1 * | 4/2009 | Sudjian et al. | 327/199 |
| 7,548,104 B2 | 6/2009 | Bhowmik et al. | |
| 8,390,329 B1 | 3/2013 | Sridhara | |
| 2010/0194446 A1 | 8/2010 | Ku | |
| 2010/0253406 A1 | 10/2010 | Seefeldt et al. | |

* cited by examiner

*Primary Examiner* — Vibol Tan
(74) *Attorney, Agent, or Firm* — Gard & Kaslow LLP (57) ABSTRACT

A delay circuit in which the delay is independent of variations in the power supply which powers the logic gates of the delay circuit is disclosed. By separating the CMOS transistors that form each logic gate by additional CMOS bias transistors which are biased at a controlled voltage, variations in the gate delay of the inverter transistors due to variations in the power supply voltage for the inverter transistors may be minimized. In one embodiment, the constant bias voltage may be provided by a constant current source comprising a series of amplifiers each having a gain significantly less than one connected to a triple cascode.

15 Claims, 10 Drawing Sheets

DELAY CIRCUIT INDEPENDENT OF SUPPLY VOLTAGE

This application claims priority from Provisional Application No. 61/839,309, filed Jun. 25, 2013, which is incorporated by reference herein in its entirety.

FIELD OF THE INVENTION

The present invention relates generally to logic gates, and more particularly to logic gate inverters used as delay elements.

BACKGROUND OF THE INVENTION

Logic gates are very well known and are the basic building blocks of digital circuits. Due to the physics of the semiconductor materials from which such devices are constructed, each logic gate has a "gate delay" or "propagation delay," i.e., the small but finite amount of time it takes for a signal to propagate from the gate input through the gate to the gate output. Various definitions include a more detailed explanation of what gate delay is, stating, for example, that each signal must be stable and valid to change, or that the gate delay is the time required for the output to reach 50% of its final output level when the input changes to 50% of its final input level. However, regardless of how it is defined, digital circuits must take gate delay into account, so that a device does not rely on a signal before it arrives at a desired gate input, and tools exist to assist in the design of circuits in which the delay of a logic gate, and variation in that delay due to variations in the manufacturing process or other reasons, does not cause a digital design to fail.

For example, microprocessors may contain many millions of logic gates, and must be carefully designed to ensure that they operate as expected given the delays of all of those logic gates. In fact, the cumulative delay of all of the logic gates in a microprocessor is a limiting factor in the speed of the microprocessor. For this reason, designers of microprocessors often use a "worst case" gate delay that is longer than the typical or average gate delay time, and which limits the designated, or guaranteed, speed of the microprocessor as such a worst case assumption results in a design allowing for longer gate delays that may result from such things as high temperature or a low power supply. Such conservative design thus also allows for methods of "overclocking" microprocessors, in which the device may be made to run faster than its designated speed on the assumption that the extreme conditions that increase gate delay are not expected to occur so that the gate delay will be significantly less than the worst case, and the speed of the microprocessor may thus be faster than that specified by the manufacturer.

There are specific uses of logic gates where the actual delay time and its variability are important. One such example is when a logic gate, typically an inverter, is used to make a delay line; the total delay of a chain of inverters will be the sum of the delay times of each inverter. If the inverters are identical (or as close to identical as manufacturing variations will allow), then the delay line will have a delay time equal to the delay of a single inverter times the number of inverters in the delay line.

The actual delay time in a chain of, for example, 100 inverters may affect the specification of the circuit and thus the actual delay of each inverter and its variability may be important in such a case. One specific example of such a case is a delay line in a Finite Impulse Response (FIR) filter, in which is it common for a chain of identical inverters to function as the delay line in that filter. The frequency response characteristics of such a FIR filter, and its group delay, will depend on the actual delay in the logic gates of the inverters.

Specifically, a FIR filter constructed from a chain of 100 inverters connected to 100 weighting coefficients has a frequency response characteristic that is directly proportional to the delay of the inverters, and thus the overall delay line. For example, a filter using a delay line with inverters each having a 1 nanosecond (nS) delay and designed to have a band pass frequency response centered on 50 megahertz (Mhz), will not work properly when the actual delay of the inverters is shorter, for example 800 picoseconds (pS), because the center of the band pass frequency in such a case will no longer be 50 Mhz but will instead be 62.5 Mhz (50 Mhz*1 nS/800 pS). Furthermore, since the group delay of a FIR filter is generally equal to half the total delay time, the group delay of such a filter in this example will not be 50 nS as desired, but would change to 40 nS if the delay of each inverter were to change from 1 nS to 800 pS.

One of the primary reasons for such a variation in the delay of a logic gate is a variation in the voltage level of the power supply applied to the gate. A logic gate such as an inverter may typically be comprised of transistors designed to operate from a power supply having a voltage of 1.2 V and provide, for example, 100 pS of delay. That same logic gate will provide something closer to 80 pS of delay if operated from a power supply of 1.32 V, and perhaps 120 pS of delay if operated from a power supply of 1.08 V.

A FIR filter constructed with delay elements using inverters would thus have a frequency specification and group delay that varies with the voltage level of the power supply, because the delay of the inverters changes with the voltage level of the power supply.

It is therefore desirable to be able to modify a delay line comprised of delay elements, specifically inverters, such that delay of the delay line is not dependent on the power supply. Such a modification would result in a delay that is insensitive to the power supply variation, and when used in, for example, a FIR filter circuit, the parameters of the filter would no longer be susceptible to power supply variations. However, such a modification is not limited to just inverters used as delay elements; rather, if it were applied to NAND gates, NOR gates, DFF's. etc., then they too would exhibit a delay that is not dependent on the power supply voltage.

SUMMARY OF THE INVENTION

An apparatus for reducing or eliminating variations in gate delay due to variations in the power supply voltage is disclosed.

One embodiment discloses an inverter for inverting an input signal comprising: a first PMOS transistor having a gate which receives the input signal, a source connected to a voltage supply, and a drain; a second PMOS transistor having a gate which receives a first bias voltage, a source connected to the drain of the first PMOS transistor, and a drain; a first NMOS transistor having a gate which receives a second bias voltage, a drain connected to the drain of the first PMOS transistor, and a source; and a second NMOS transistor having a gate which receives the input signal, a drain connected to the drain of the second PMOS transistor and the source of the first NMOS transistor, and a source connected to a ground; wherein the first bias voltage and the second bias voltage are controlled voltages.

Another embodiment discloses a delay line for receiving and delaying an input signal comprising a plurality of inverters, each inverter comprising: a first PMOS transistor having a gate which receives the input signal, a source connected to a voltage supply, and a drain; a second PMOS transistor having a gate which receives a first bias voltage, a source connected to the drain of the first PMOS transistor, and a drain; a first NMOS transistor having a gate which receives a second bias voltage, a drain connected to the drain of the first PMOS transistor, and a source; and a second NMOS transistor having a gate which receives the input signal, a drain connected to the drain of the second PMOS transistor and the source of the first NMOS transistor, and a source connected to a ground; wherein the drain of the first PMOS transistor in one inverter is connected to the gate of the PMOS transistor in the next inverter, and the source of the first NMOS transistor in one inverter is connected to the gate of the NMOS transistor in the next inverter.

DETAILED DESCRIPTION OF THE INVENTION

Described herein is a delay circuit in which the delay is independent of variations in the power supply which powers the gates of the delay circuit, and the method of constructing such a circuit.

It is well known that a conventional delay line may be easily constructed from a series of inverters, and that an inverter may comprise a pair of CMOS transistors, one PMOS transistor and one NMOS transistor. However, as above, such a delay line will typically suffer from variations in the delay of each inverter due to variations in the voltage of the power supply connected to the PMOS transistors.

By separating the CMOS transistors that form each inverter by additional CMOS bias transistors which are biased at a controlled voltage, variations in the gate delay of the inverter transistors due to variations in the power supply voltage for the inverter transistors may be minimized. In one embodiment, the controlled bias voltage may be provided by a constant current source comprising a series of amplifiers each having a gain significantly less than one and connected to a triple cascode.

Figure 1:
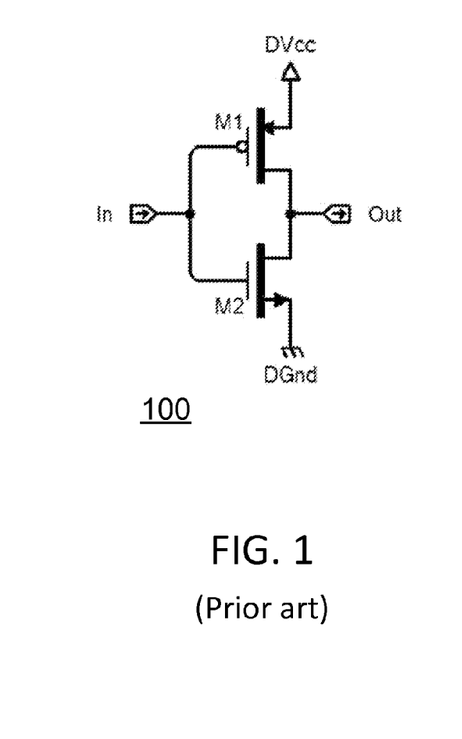
FIG. 1 is a schematic diagram of a typical prior art CMOS inverter.

FIG. 1 shows one well known type of logic gate, an inverter 100. As shown, the inverter 100 is what is known as a static CMOS inverter, made from two MOSFET transistors, and includes a PMOS transistor M1 and an NMOS transistor M2. The gates of both transistors M1 and M2 are connected to the input node and receive an input signal In, and the drains of both transistors are connected to the output node Out. The source of PMOS transistor M1 is connected to a voltage source having a voltage DVcc, and the source of NMOS transistor M2 is connected to a ground DGnd.

As is common in CMOS devices, the inverter 100 pairs the PMOS transistor M1 with the NMOS transistor M2 and connects both gates and both drains together. PMOS transistor M1 has a low resistance between its source and drain contacts when a low gate voltage is applied and a high resistance when a high gate voltage is applied, while NMOS transistor M2 has the opposite effect, a high resistance between source and drain when a low gate voltage is applied and a low resistance when a high gate voltage is applied. A low voltage input In will thus cause PMOS transistor M1 to conduct and NMOS transistor M2 to not conduct, while a high voltage input in will cause the reverse actions.

The inverter 100 uses these principles to achieve inversion of the input signal In. When the voltage of input In is low, the channel of NMOS transistor M2 is in a high resistance state. This limits the current that can flow from the output node Out to ground. The channel of PMOS transistor M1 is in a low resistance state and much more current can flow from the supply DVcc to the output node Out. Because the resistance between the supply voltage DVcc and the output node Out is low, the voltage drop between the supply voltage DVcc and Out due to a current drawn from DVcc is small. The output node Out therefore registers a high voltage.

On the other hand, when the voltage of input In is high, PMOS transistor M1 is in a high resistance state so it limits the current flowing from the voltage supply DVcc to the output, while NMOS transistor M2 is in a low resistance state, allowing the voltage at output node Out to be connected to the ground DGnd through a low resistance. The voltage drop due to a current drawn into the node Out placing Out above ground, or zero, is small. This low drop between the output node Out and ground results in the output node Out registering a low voltage.

In short, the outputs of PMOS transistor M1 and NMOS transistor M2 are complementary such that when the input is low, the output is high, and when the input is high, the output is low. Because of this behavior of input and output, the output of inverter 100 is the inverse of the input.

There is a small but finite switching time for each of the transistors M1 and M2 which causes the gate delay, i.e., the delay in a change in the input signal applied to node In being reflected at the output node Out. As above, this delay will vary with variations in the power supply voltage DVcc. Further, during this switching time there will be a small period during which both transistors conduct briefly, or "overlap," as the gate voltage, i.e., the input signal In, goes from one state to another, which can result in what is called "shoot through" current, i.e., current flowing directly from the power supply to ground.

Figure 2:
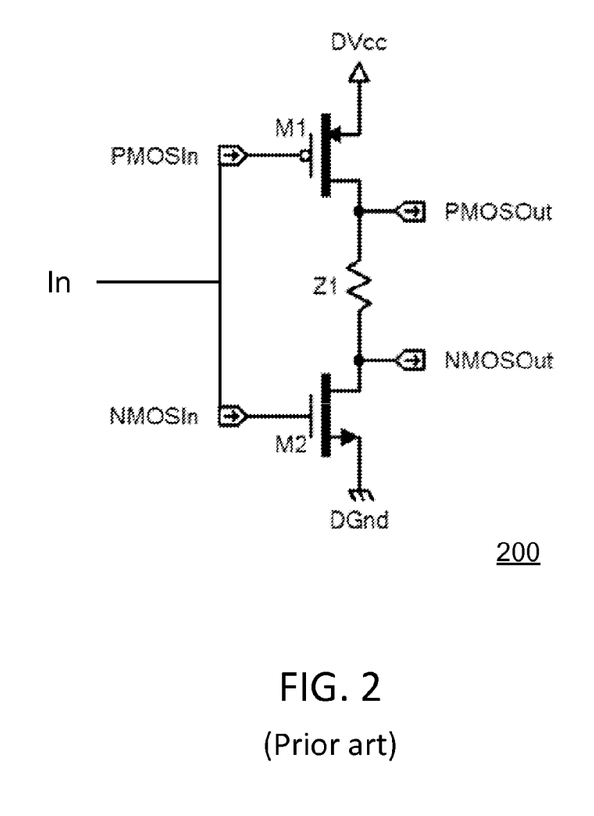
FIG. 2 is a schematic diagram of another prior art CMOS inverter.

FIG. 2 shows another prior art inverter 200, again implemented in CMOS devices. Here the transistors M1 and M2 still both receive the input signal In, split into an input PMOSIn to transistor M1 and an input NMOSIn to transistor M2. Now, however, there are two output nodes, a first output node PMOSOut, which is connected to the drain of PMOS transistor M1, and a second output node NMOSOut, which is connected to the drain of NMOS transistor M2. The two drains, and thus the output nodes PMOSOut and NMOSOut, are separated by an element Z1 having some impedance, such as the resistor illustrated in FIG. 2. The use of the two output nodes is explained further below.

It may be seen that when the input signal In goes high, NMOS transistor M2 will still drive the output node NMOSOut to go down quickly, while when input signal In goes low, PMOS transistor M1 will drive the output node PMOSOut to go up quickly. However, the effect of the impedance of element Z1 is to cause transistor M1 to drive the output PMOSOut down more slowly when input signal In goes high, and output NMOSOut to go up more slowly when input signal In goes low. Thus, if there is another inverter after inverter 200, if PMOSOut and NMOSOut are connected to the gates of the PMOS and NMOS transistors in the next inverter, i.e., they are the signals PMOSIn and NMOSIn for the next inverter, then the overlap time when both transistors are on will be reduced and the next inverter will have less shoot through current. (Note that where there are multiple inverters, PMOSIn and NMOSIn will thus not be identical for any inverter other than the first one.)

Thus, inverters such as inverter 200 of FIG. 2 try to solve the problem of variable time of operation of transistors M1 and M2 due to power supply variations by adding more time by slowing down the signal ramp due to the time taken for the output signal to propagate across impedance element Z1, so that the varying time of operation of transistors M1 and M2 becomes less significant. However, this generally results in a relatively large increase in the delay time of the inverter. Further, impedance element Z1 is typically a resistor, and due to limitations in manufacturing processes is itself subject to variability in value and thus in the resulting delay.

Figure 3:
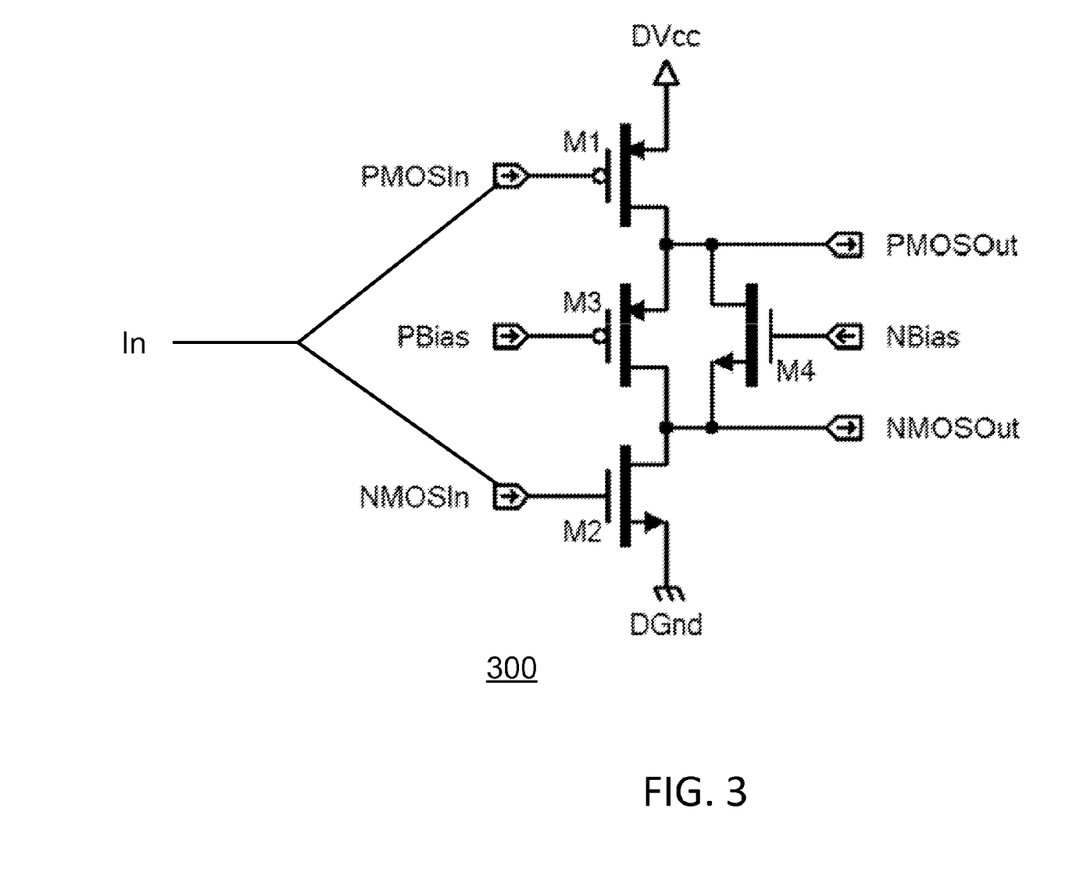
FIG. 3 is a schematic diagram of a delay element according to one embodiment.

FIG. 3 shows still another inverter 300. In inverter 300, the impedance element Z1 of inverter 200 in FIG. 2 has been replaced by two additional bias transistors, PMOS transistor M3 and NMOS transistor M4. PMOS transistor M3 and NMOS transistor M4 are connected in parallel between the two drains of PMOS transistor M1 and NMOS transistor M2. The source of PMOS transistor M3 and the drain of NMOS transistor M4 are connected to the drain of PMOS transistor M1 and output node PMOSOut, while the drain of PMOS transistor M3 and the source of NMOS transistor M4 are connected to the drain of NMOS transistor M2 and output node NMOSOut.

The gates of PMOS transistor M3 and NMOS transistor M4 receive bias voltages Pbias and Nbias respectively. These bias voltages are nominally fixed and do not change in voltage during operation. The generation of these bias voltages will be explained further below.

If the input signal does not change, then of course the output signal will not change. Thus, if the signal on input node In remains high, PMOS transistor M1 will remain in a high resistance state, NMOS transistor M2 will remain in a low resistance state, and the output will remain low. Conversely, if the input signal on input node In remains low, PMOS transistor M1 will remain in a low resistance state, NMOS transistor M2 will remain in a high resistance state, and the output will remain high.

When the input signal In changes, the voltages of PMOSOut and NMOSOut will change, as with inverters 100 of FIG. 1 and 200 of FIG. 2. How, however, the delay time it takes for the output to change will not be limited by the speed of transistors M1 and M2, as in inverter 100 of FIG. 1, or by the propagation of a signal through impedance element Z1 in as in inverter 200 of FIG. 2. Rather, the delay time of inverter 300 will be controlled by the time it takes a signal to propagate through one of the other of bias transistors M3 and M4 in FIG. 3, i.e., the time it takes for a new output to be reached will depend upon how fast the new output voltage level, whether DVcc or DGnd, propagates across one transistor or the other respectively. This delay time in turn will depend upon the bias voltage applied to the bias transistors M3 and M4.

By controlling the voltages of Pbias and Nbias, the speed with which voltages change from source to drain in transistors M3 and M4 may be controlled, and thus the speed of inverter 300, since the speed with which the appropriate new voltage level for the output passes through transistors M3 and M4 when the input signal changes becomes the limiting time of the device, rather than the speed of transistors M1 and M2. By causing this minimum fixed delay to always be greater than the expected variability in the operation of transistors M1 and M2, the time delay of inverter 300 may be fixed so that the variability of gate delay in transistors M1 and M2 thus becomes irrelevant.

Figure 4:
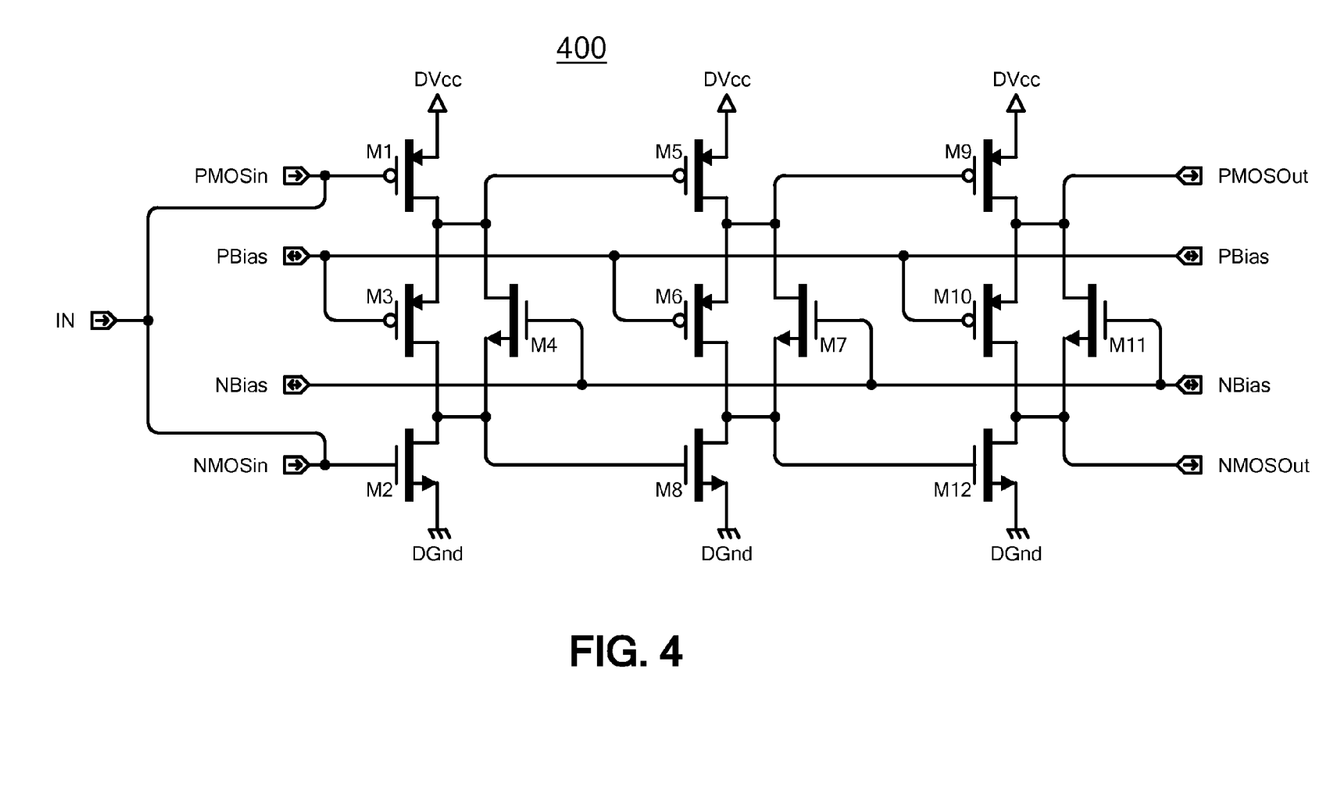
FIG. 4 is a schematic diagram of a delay line comprised of three delay elements according to one embodiment.

FIG. 4 shows a delay line 400 comprising three instances of the inverter 300 of FIG. 3 connected together. The output node PMOSOut of each such inverter, i.e., the drain of the PMOS transistor of each inverter, is connected to the gate of the PMOS transistor in the next inverter, while the output node NMOSOut of each inverter, i.e., the drain of the NMOS transistor of each inverter, is connected to the gate of the NMOS transistor in the next inverter. The output nodes PMOSOut and NMOSOut of the last inverter result in the final output of the delay line. The gate of each PMOS bias transistor M3, M6 and M10 is connected to a single bias voltage Pbias, and the gate of each NMOS bias transistor M4, M7 and M11 is similarly connected to a single bias voltage Nbias.

To see how the bias transistors control the delay of the delay line, consider a high input signal at the input node In. When the input In is high, transistor M2 will turn on, i.e., have low resistance, and the value of NMOSOut from transistor M2 will be pulled to ground with no (i.e., minimal) delay. This will in turn cause the next NMOS transistor M8 to immediately turn off (have high resistance), as there is no virtually no propagation delay from the now-low output of transistor M2 to the gate of transistor M8. Thus, since transistor M8 is now off, no signal can propagate from M8 to M12.

On the other hand, the only way for NMOS transistor M12 to turn on, or go to low resistance, is to receive the high voltage DVcc through transistors M6 and M7, which in turn only receives that voltage when PMOS transistor M5 is on, i.e., receiving a low input signal. Further, PMOS transistor M5 only receives a low input signal from transistor M2 through transistors M3 and M4. Thus, any signal reaching transistor M12 must pass through transistors M3 and M4 first, and then through M6 and M7.

Similarly, if the input In is low, PMOS transistor M1 will turn on, or go to low resistance, and the value at node PMOSOut from transistor M1 will be high, turning off PMOS transistor M5 immediately, so that again no signal can propagate from M5 to M9. PMOS transistor M5 will similarly only turn on when it receives a low signal, i.e., is connected to ground through transistors M3 and M4.

It may thus be seen that turning a transistor off may occur almost immediately when the input to that transistor disappears, but turning a transistor on requires that a signal pass through bias transistors. An NMOS transistor is only turned on (i.e., has low resistance) when a high input voltage is seen at its gate, and this can only occur for NMOS transistors other than M2 by DVcc passing through bias transistors. Similarly, a PMOS transistor is only turned on by a low input voltage at its gate, which for any PMOS transistors other than M1 will only be seen by the input going to ground, again through bias transistors.

Thus, when the signal at input node In changes, the new signal will be propagated down the delay line at a speed dictated by the delay of each inverter as limited by the bias transistors, rather than by the speed of the transistors that accept the input signal and provide delayed output signals. If the bias lines Pbias and Nbias are provided with voltages derived from a constant current, the delay will be constant and independent of the power supply voltage DVcc.

Figure 5:
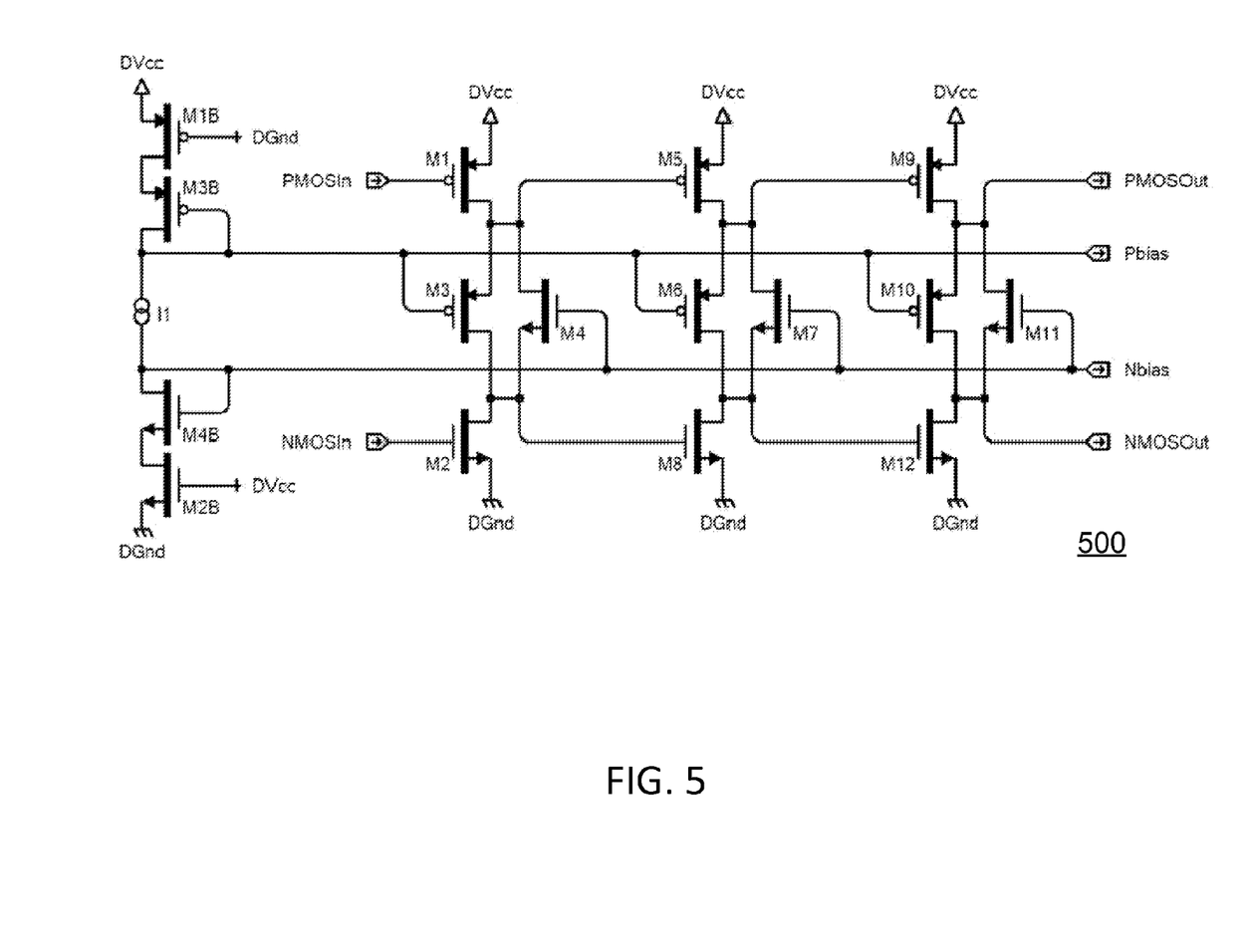
FIG. 5 is a schematic diagram of the delay line of FIG. 4 with bias voltages provided by a constant current source according to one embodiment.

FIG. 5 shows one such embodiment of a delay line 500 that incorporates the delay line 400 of FIG. 4 and a power supply that provides the bias voltages. Constant current source I1 provides a constant current independent of the power supply voltage, and transistors M3B and M4B define the bias voltages. PMOS transistor M3B is selected to have the same transconductance Gm (or as close as possible within manufacturing variations) as transistors M3, M6 and M10, i.e., the PMOS bias transistors, while NMOS transistor M4B is similarly selected to have the same transconductance Gm as transistors M4, M7 and M11, the NMOS bias transistors.

The use of transistors M3B and M4B will define the voltages on the bias lines as constant to a first order and cause the delay line 500 to have a nearly constant delay. However, variations in the supply voltage DVcc will still have a small effect on the delay time of the transistors that handle the input signal, and thus on the overall delay time of the delay line. Adding transistors M1B and M2B provides better compensation for such variations in the supply voltage DVcc. PMOS transistor M1B is selected to have the same transconductance Gm as PMOS transistors M1, M5 and M9, while NMOS transistor M2B is selected to have the same transconductance Gm as NMOS transistors M2, M8 and M12.

The variation in degree to which transistors M1B and M2B turn on due to variations in the power supply voltage DVcc is the same as the variations in transistors M1, M5 and M9, and M2, M8 and M12 respectively. Thus, the addition of transistors M1B and M2B provides compensation for variations in the power supply voltage DVcc, and results in a more constant delay time. In a typical case, a change in the delay time of a delay line due to changes in the power supply voltage might be as great as ±30%, while the use of a circuit such as circuit 500 of FIG. 5 can reduce the change in the delay time to less than ±1%, making the delay of the input signal essentially independent of the power supply voltage DVcc.

Figure 6:
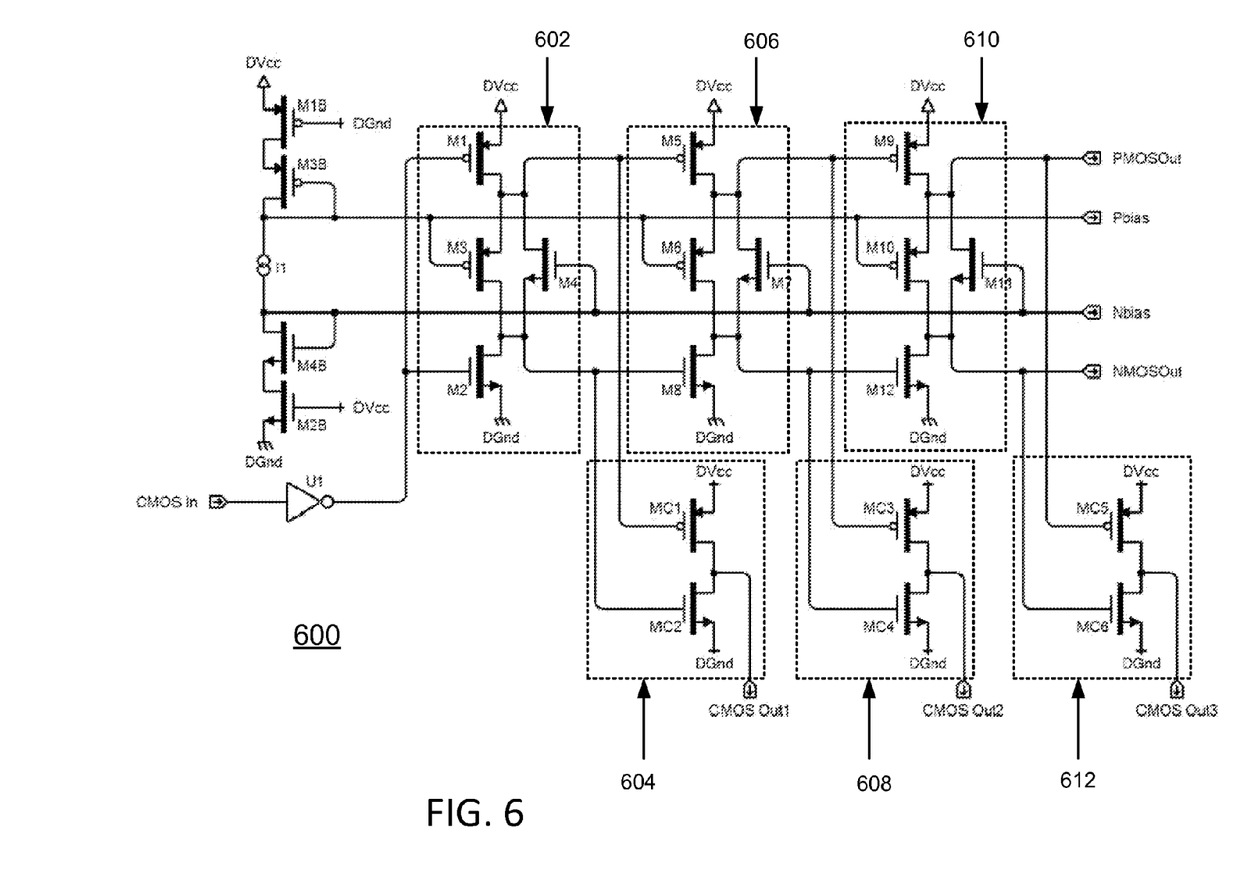
FIG. 6 is a schematic diagram of the delay line of FIG. 5 with signal taps for obtaining an output signal according to one embodiment. After each inverter in the delay line

The output signal is obtained in a conventional way from the delay line of FIGS. 4 and 5. FIG. 6 is a schematic diagram of a circuit 600 containing the delay line of FIG. 5 with signal taps for obtaining an output signal according to one embodiment. It will be seen that the input signal CMOSin is connected to the input nodes PMOSin and NMOSin, and is thus fed to the first inverter 602 in the delay line. Inverter 602 is, as above, comprised of two transistors, a PMOS transistor M2 and an NMOS transistor M13, separated by two bias transistors, a PMOS transistor M6 and an NMOS transistor M9. Input signal CMOSin is input to the gates of transistors M2 and M13 as above, and as previously explained will be inverted by inverter 602, and again by the subsequent inverters 606 and 610 in the delay line.

After each inverter in the delay line, or any convenient number of inverters depending upon the desired output signal, a tap is attached to extract a delayed sample of the input signal; as is well known in the art, each of the delayed samples will be effectively multiplied by a coefficient of a Fourier series and the samples then added together to provide an output signal having a desired response given by a Fourier series corresponding to the coefficients. Thus, a first tap 604 extracts an inverted sample of the input signal after inverter 602 which also causes a delay in the sample, a second tap 608 extracts another sample of the input signal after inverter 606, now inverted and delayed twice, a third tap 612 extracts a third sample of the input signal after inverter 610 delayed and inverted three times, etc. These samples may, for example, then each be passed through an impedance element comprising a component of a FIR filter and representing a coefficient in a Fourier series providing the desired frequency response of the filter and then summed to obtain an output signal of the desired frequency response.

Each tap 604, 608 and 612 is itself an inverter. Thus, tap 604 is comprised of PMOS transistor MC1 and NMOS transistor MC2 in the same prior art configuration shown in FIG. 1. Tap 604 receives the same output of inverter 602 that is passed on to the next inverter 606 in the delay line. Thus, the gate of transistor MC1 is connected to the drain of transistor M2 and receives PMOSOut as does transistor M3 in inverter 606, and the gate of transistor MC2 is connected to the drain of transistor M13 and receives NMOSOut as does transistor M14 in inverter 606. One of skill in the art will be familiar with which of the output signal components should be again inverted to get an output signal of the desired frequency response. See, for example, U.S. Pat. No. 8,504,601, commonly owned by the assignee of the present application.

One of skill in the art will also know of various ways to design the constant current source I1 used to generate the bias line voltages. For example, it is well known to use a band gap reference cell and op-amp in a voltage-to-current configuration. However, band gap circuits are not easily made in CMOS. Further, band gap cells typically result in an output of about 1.2 volts, and if the desired power supply is also 1.2 volts there will be no headroom in the circuit. Thus, a better constant current source that does not use a band gap reference cell or an op-amp would be desirable.

Figure 7:
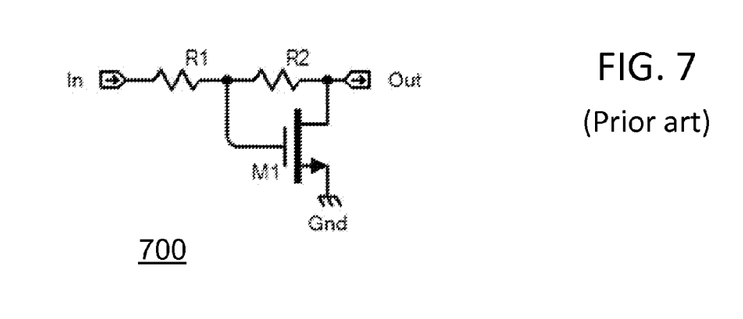
FIG. 7 is a schematic diagram of a prior art amplifier circuit.

One particular embodiment of such a constant current source is now described. FIG. 7 shows a simple prior art circuit 700 comprised of a transistor M1 and two resistors having resistances R1 and R2. No bias voltage is necessary if the input voltage In is high enough to activate transistor M1, i.e., higher than the threshold voltage of transistor M1. To a first order approximation, transistor M1 in circuit 700 functions as an amplifier with a gain of approximately −R2/R1. However, one of skill in the art will appreciate that this is an approximation, and that reducing the gain to this formula requires that the transistor M1 have a transconductance (Gm) that is high enough that it can be ignored.

Consider that if R2 is a short circuit, i.e., a wire of essentially no resistance, then circuit 700 becomes a diode, so that if the input goes up so does the output and the gain is positive. At the other extreme, if R1 is 10 kilohms (KΩ) and R2 is 10 megohms (MΩ), then the gain will be approximately −10 M/10K=−1000. Thus, there must be a value of R2 in between zero and 10 MΩ for which the gain is zero and the output voltage does not change when the input voltage changes. In this case, circuit 700 may be considered a "zero gain amplifier."

This value of R2 at which the circuit 700 is an amplifier with zero, or near zero, gain is the inverse of the transconductance Gm of the transistor. If R2=1/Gm, then the gain is −R2/R1=−1/(R1*Gm). As Gm gets larger the gain gets smaller; if Gm is large enough the gain is nominally zero and the output is a fixed voltage that will not change when the input voltage changes. In practice, it is difficult to make the value of R2 be precisely equal to 1/Gm, due to variations in the resistance of the resistor and in the transconductance Gm of transistor M1. However, it is possible to make the value of R2 close to 1/Gm, so that the gain of circuit 700 is significantly less than 1.

Figure 8:
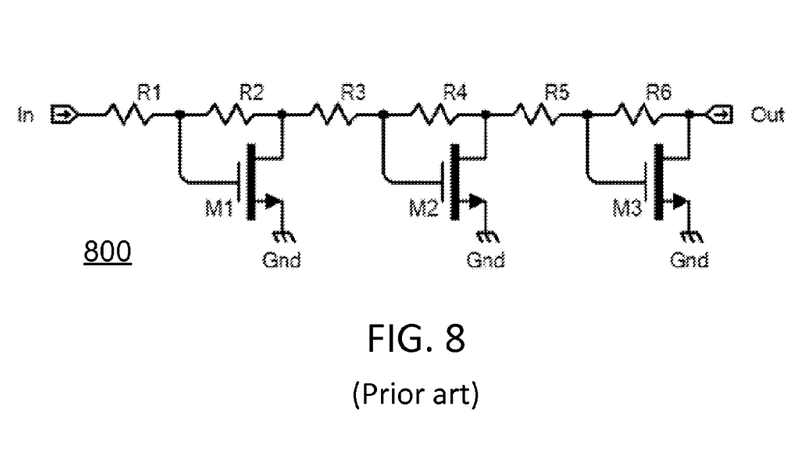
FIG. 8 is a schematic diagram of an amplifier circuit comprised of three prior art amplifier circuits of FIG. 7 in series.

FIG. 8 shows a circuit 800 comprised of three zero gain amplifiers such as circuit 700 of FIG. 7 placed in series. As in FIG. 7, the value of R2 is set close to 1/Gm of transistor M1. Similarly, the value of R4 is set close to 1/Gm of transistor M2, and R6 is close to 1/Gm of transistor M3. Although the gain across each transistor may not be precisely zero, the effect is cumulative, so that if the gain across each transistor is 0.1, the overall gain will be 0.1 times 0.1 times 0.1, or 0.001. This results in the output voltage Out being essentially independent of the input voltage In.

The input voltage In to circuit 800 might, for example be 1.2 volts, transistor M1 might have a nominal threshold of 350 millivolts (mV) but actually see 400 mV at its gate, and the voltage at the source of transistor M1, the point between resistors R2 and R3, might also be 400 mV. In this case, there will be enough voltage applied to the gates of transistors M2 and M3 to turn them on, but the output of each, i.e., the voltage at the drain, and the current passing through each will successively drop, so that the output voltage Out will be close to the threshold of transistor M3 and very little current will pass through M3. For example, the output of transistor M2 might be 300 mV, and the final output of transistor M3, and thus the output Out of circuit 800, might be 240 mV.

Figure 9:
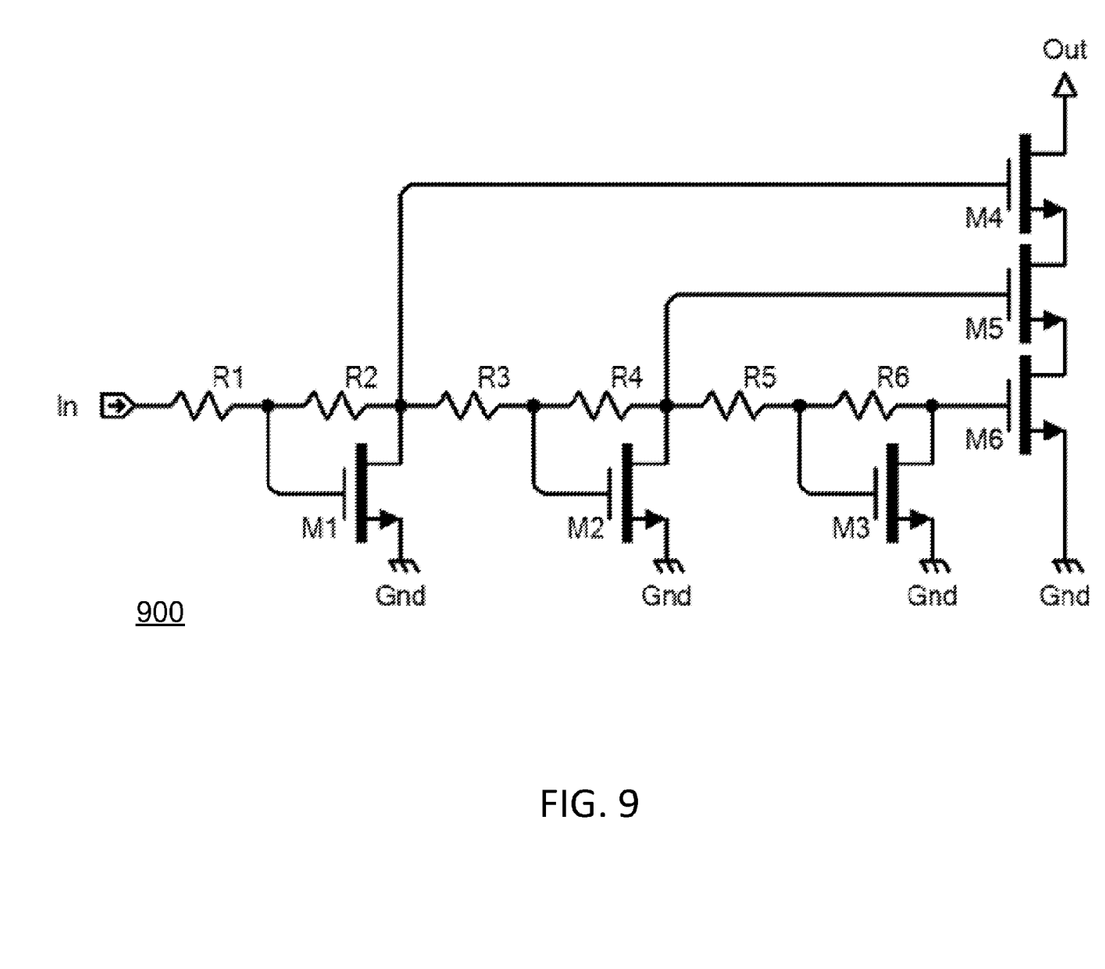
FIG. 9 is a schematic diagram of a constant current source comprised of the amplifier circuit of FIG. 8 and a triple cascode.

With the use of a circuit such as circuit 800 of FIG. 8 in which the voltage successively drops, the constant voltage at the output may be converted to a constant output current with a set of cascode transistors. FIG. 9 shows a circuit 900 in which the circuit 800 of FIG. 8 feeds such a set of cascode transistors.

As in circuit 800, in circuit 900 the values of the resistors R1 to R6 are such that the input voltage In is greater than the voltage at the drain of transistor M1, which in turn is greater than the voltage at the drain of transistor M2, which again in turn is greater than the voltage at the drain of transistor M3. Now, however, in addition to the constant voltage generated at the drain of transistor M3, which is placed on the drain of a transistor M6, circuit 900 also generates voltages for the other two transistors M4 and M5, which, with transistor M6, form a triple cascode. The voltage at the drain of transistor M1 goes to the gate of transistor M4, and the voltage at the drain of transistor M2 goes to the gate of transistor M5.

Thus, transistor M4 receives a higher voltage at its gate than transistor M5, which in turn receives a higher voltage than the gate of transistor M6. The current that flows through transistors M4, M5 and M6 will be independent of the input voltage in, as well of the output voltage, i.e., the voltage at the drain of transistor M3 and the gate of transistor M6. The resulting output impedance at the current output node (output Out in FIG. 9) is well above 10 MΩ in the typical case.

Figure 10:
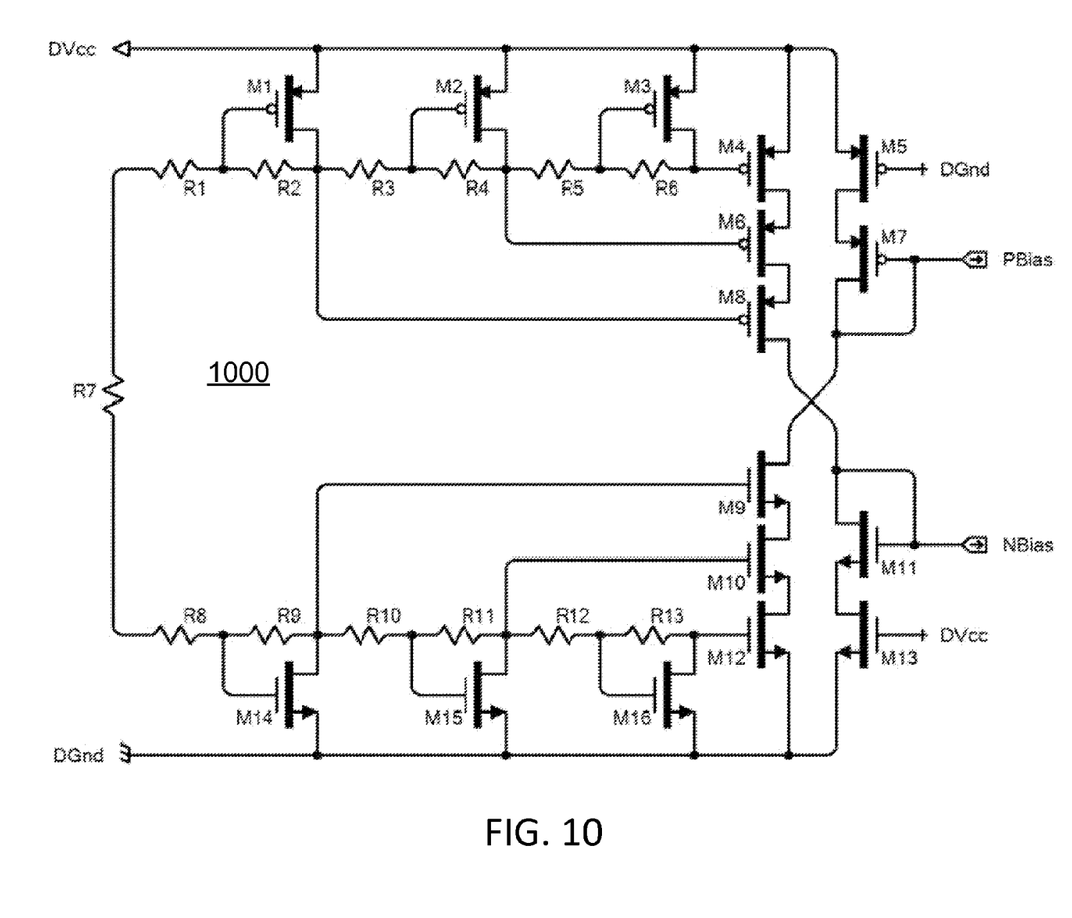
FIG. 10 is a schematic diagram of another constant current source comprised of the circuit of FIG. 9 and a similar circuit of complementary devices.

Circuit 900 of FIG. 9 is illustrated as being comprised of NMOS transistors, but a similar circuit may be made with PMOS transistors in the same way, except that the sources of transistors M1, M2, M3 and M6 will be connected to a voltage rather than to ground. FIG. 10 shows a circuit 1000 that is comprised of the circuit 900 of FIG. 9 and a similar circuit comprised of PMOS devices.

In circuit 1000, transistors M9, M10, M12, M14, M15 and M16, and resistors R6 through R11 comprise the circuit 900 from FIG. 9. Transistors M1 through M4, M6 and M8, and resistors R1 through R6 comprise a similar circuit, but in which the transistors are PMOS transistors rather than NMOS transistors, and thus the sources of transistors M1 through M4 are connected to the power supply voltage DVcc rather than to ground. Since the input voltage to either chain of zero gain amplifiers does not matter, R6 may be common to both the NMOS and PMOS portions of circuit 1000, as long as the voltage difference between DVcc and DGnd is greater than the sum of the zero gain voltage of transistors M1 and M14.

These two portions of the circuit form a constant current source, such as current source I1 in circuit 500 of FIG. 5. The additional PMOS transistors M5 and M7 and NMOS transistors M11 and M13 in circuit 1000 are used to generate the fixed values of PBias and NBias in a similar fashion to transistors M1B to M4B in circuit 500 of FIG. 5.

By using a delay line in which the CMOS transistors that form each inverter are separated by additional CMOS bias transistors which are biased at a constant voltage, variations in the gate delay of the inverter transistors due to variations in the power supply voltage for the inverter transistors are minimized. In one embodiment, the constant bias voltage may be provided by a constant current source comprising a series of amplifiers each having a gain less than one in a triple cascode.

The same principle may be applied to more complex logic gates to cause them to operate with a delay independent of the power supply, by recognizing that more complex logic gates may be made by modifying the inverter of FIG. 3 by substituting any serial or parallel combination of PMOS transistors for PMOS transistor M1 and any serial or parallel combination of NMOS transistors for NMOS transistor M2.

Figure 11:
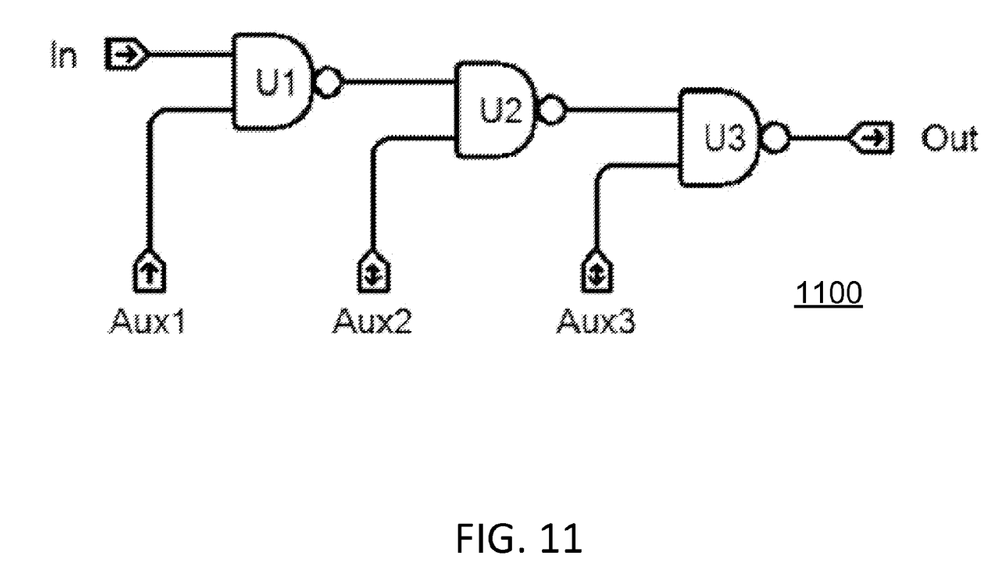
FIG. 11 is a schematic diagram of a line of three prior art NAND gates that may be used as a delay line.

FIG. 11 shows a circuit 1100 comprising a chain of three NAND gates U1, U2 and U3. NAND gate U1 receives inputs In and Aux 1, while NAND gate U2 receives the output of NAND gate U1 and Aux2 and NAND gate U3 receives the output of NAND gate U2 and Aux 3. One of skill in the art will appreciate how to build a NAND gate from CMOS elements by placing two PMOS transistors in parallel in place of transistor M1 of FIG. 3, and two NMOS transistors in series in place of transistor M2 of FIG. 3.

When built in a conventional manner, such a circuit will have similar timing issues to those of the inverter discussed above, i.e., the delay times of the transistors will again vary as the voltage supply varies. If the circuit 1100 is also intended to include a delay line function, i.e., a constant delay from the input signal in to the output signal Out, such variability will again be undesirable as it is in the case of the inverter above.

Figure 12:
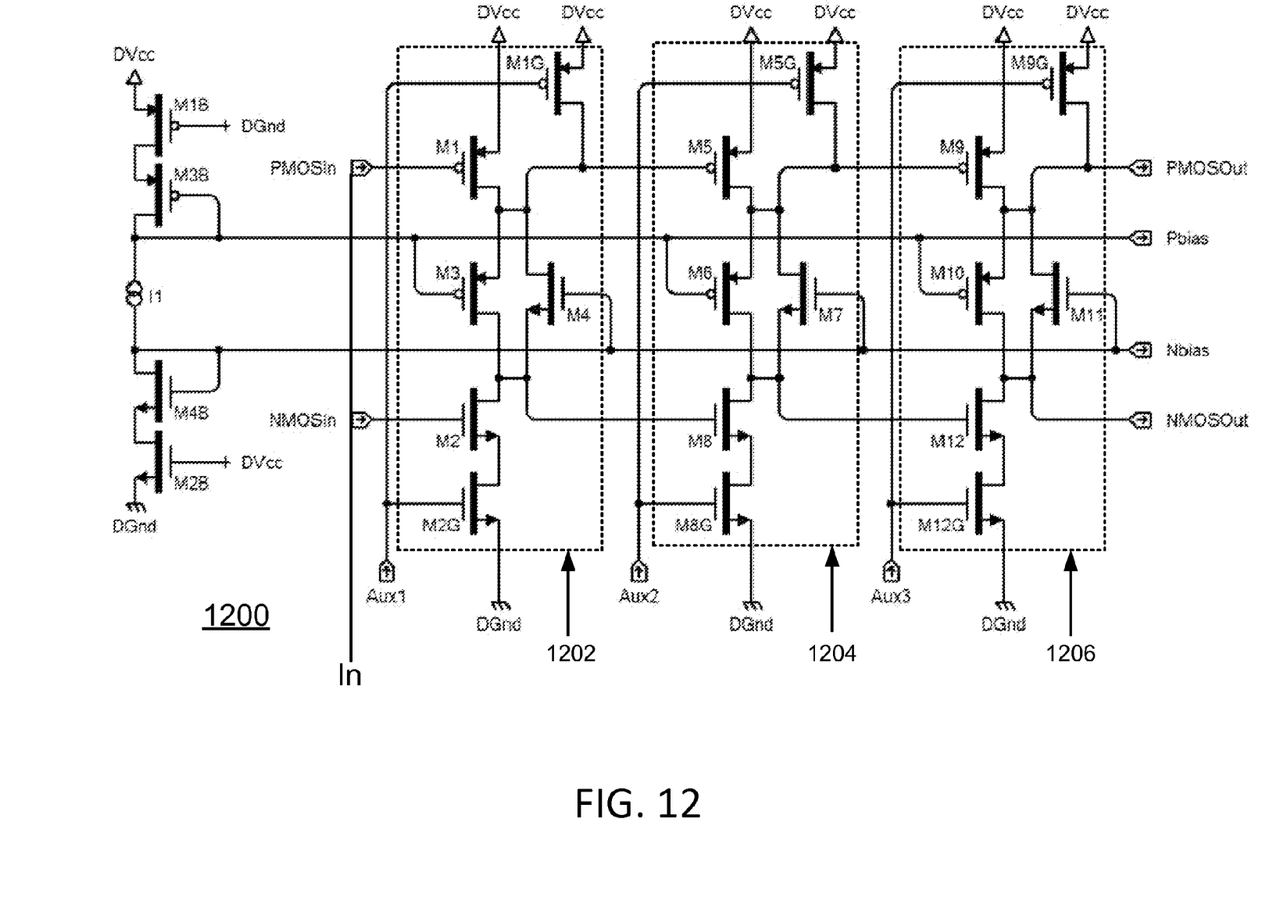
FIG. 12 is a schematic diagram of a delay line comprised of three NAND gates according to one embodiment.

FIG. 12 shows the use of a bias line in such a NAND gate circuit. Instead of an inverter comprised of one PMOS transistor and one NMOS transistor, a first NAND gate 1202 is comprised of two PMOS transistors M1 and M1G in parallel and two NMOS transistors M2 and M2G in series. As with the bias line of the delay line 500 of FIG. 5, in FIG. 12 a bias line separates the PMOS transistors from the NMOS transistors; in NAND gate 1202, the bias transistors are PMOS transistor M3 and NMOS transistor M4.

NAND gates 1204 and 1206 are similarly constructed, with bias transistors M6 and M7 in NAND gate 1204 and bias transistors M19 and M1 in NAND gate 1206. The bias transistors receive a bias voltage from a constant current source of the same type described with respect to FIG. 5. As with delay line 500 of FIG. 5, circuit 1200 of FIG. 12 will exhibit a constant delay regardless of variations in the power supply voltage DVcc.

In any CMOS circuit in which the drain of a PMOS transistor is conventionally connected to the drain of an NMOS transistor, the timing of the circuit may be made independent of variations in the power supply voltage by similar insertion of a delay line between the drains of the two transistors. Many, if not most, logic gates use such construction, for example NOR gates, DFFs, etc. The present invention may be used with any such gates.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, it will be appreciated that the entire circuit, such as circuit 500 of FIG. 5 or circuit 1200 of FIG. 12, will typically be contained on a single chip, and thus be a portion of a single wafer, so that manufacturing variations within the circuit will be minimal, possibly smaller than those variations that occur between different portions of the wafer and significantly smaller than variations between different wafers. In some embodiments, all of the PMOS transistors may be essentially identical (again within manufacturing variations) and all of the NMOS transistors may also be essentially identical. However, it is possible that in some embodiments a designer will want the bias transistors to be of different construction or dimensions than the other transistors, or an attempt may even be made to match portions of the circuit that have been manufactured from different portions of a wafer or even different wafers. Such other embodiments are still within the meaning and spirit of the present application.

These and other variations upon the embodiments are intended to be covered by the present disclosure, which is limited only by the appended claims.

What is claimed is:

1. A delay line for receiving and delaying an input signal comprising a plurality of inverters in series, each inverter comprising:
   a first PMOS transistor having a gate, a source connected to a voltage supply, and a drain;
   a second PMOS transistor having a gate which receives a first bias voltage, a source connected to the drain of the first PMOS transistor, and a drain;
   a first NMOS transistor having a gate which receives a second bias voltage, a drain connected to the drain of the first PMOS transistor, and a source; and
   a second NMOS transistor having a gate, a drain connected to the drain of the second PMOS transistor and the source of the first NMOS transistor, and a source connected to a ground;
   wherein the first PMOS and first NMOS transistors in the first inverter in the series receive the input signal, the drain of the first PMOS transistor in one inverter is connected to the gate of the PMOS transistor in the next inverter, and the source of the first NMOS transistor in one inverter is connected to the gate of the NMOS transistor in the next inverter.

2. The delay line of claim 1, further comprising a plurality of taps for obtaining delayed samples of the input signal, a separate one of the plurality of taps connected to one of the inverters such that each tap receives a delayed sample of the input signal from a separate one of the inverters.

3. The delay line of claim 2, wherein each tap further comprises:
   a third PMOS transistor having a gate connected to the drain of the first PMOS transistor of the inverter to which the tap is connected, a source connected to the voltage supply, and a drain; and
   a third NMOS transistor having a gate connected to the drain of the first NMOS transistor of the inverter to which the tap is connected, a drain connected to the drain of the third PMOS transistor, and a source connected to the ground;
   such that a signal at the connection of the drain of the third PMOS transistor and the drain of the third NMOS transistor is a delayed sample of the input signal.

4. The delay line of claim 1, wherein the first bias voltage and the second bias voltage are controlled voltages.

5. The delay line of claim 4 wherein the first bias voltage and the second bias voltage are provided by a constant current source.

6. The delay line of claim 5 wherein the constant current source comprises a plurality of zero-gain amplifiers connected in series.

7. The delay line of claim 6 wherein the constant current source further comprises a triple cascode connected to the last zero-gain amplifier of the series of zero-gain amplifiers.

8. The delay line of claim 4 wherein the first bias voltage and the second bias voltage are provided by a bias voltage source comprising:
   a constant current source, one side of which is connected to a line providing the first bias voltage and the other side of which is connected to a line providing the second bias voltage;
   a third PMOS transistor having substantially the same transconductance as the first PMOS transistors in the inverters, the third PMOS transistor having a source connected to the voltage supply, a gate connected to ground, and a drain;
   a fourth PMOS transistor having substantially the same transconductance as the second PMOS transistors in the inverters, the fourth PMOS transistor having a source connected to the drain of the third PMOS transistor and a gate and a drain both connected to the line providing the first bias voltage;
   a third NMOS transistor having substantially the same transconductance as the first NMOS transistors in the inverters, the third NMOS transistor having a gate and a drain both connected to the line providing the second bias voltage and a source; and
   a fourth NMOS transistor having substantially the same transconductance as the second NMOS transistors in the inverters, the fourth NMOS transistor having a gate connected to the voltage supply, a drain connected to the source of the third NMOS transistor, and a source connected to the ground.

9. An apparatus for receiving and delaying an input signal comprising a plurality of logic gates connected in series, each logic gate comprising:
   a first PMOS transistor having a gate, a drain, and a source connected to a voltage supply either directly or indirectly through one or more additional PMOS transistors;
   a second PMOS transistor having a gate which receives a first bias voltage, a source connected to the drain of the first PMOS transistor, and a drain;
   a first NMOS transistor having a gate which receives a second bias voltage, a drain connected to the drain of the first PMOS transistor, and a source; and
   a second NMOS transistor having a gate, a drain connected to the drain of the second PMOS transistor and the source of the first NMOS transistor, and a source connected to a ground either directly or indirectly through one or more additional NMOS transistors;
   wherein the first PMOS and first NMOS transistors in the first logic gate in the series receive the input signal, the drain of the first PMOS transistor in one logic gate is connected to the gate of the PMOS transistor in the next logic gate, and the source of the first NMOS transistor in one logic gate is connected to the gate of the NMOS transistor in the next logic gate.

10. The apparatus of claim 9, further comprising a plurality of taps for obtaining delayed samples of the input signal, a separate one of the plurality of taps connected to one of the inverters such that each tap receives a delayed sample of the input signal from a separate one of the inverters.

11. The apparatus line of claim 10, wherein each tap further comprises:
- a third PMOS transistor having a gate connected to the drain of the first PMOS transistor of the inverter to which the tap is connected, a source connected to the voltage supply, and a drain; and
- a third NMOS transistor having a gate connected to the drain of the first NMOS transistor of the inverter to which the tap is connected, a drain connected to the drain of the third PMOS transistor, and a source connected to the ground;
- such that a signal at the connection of the drain of the third PMOS transistor and the drain of the third NMOS transistor is a delayed sample of the input signal.

12. The delay line of claim 9, wherein the first bias voltage and the second bias voltage are controlled voltages.

13. The delay line of claim 12 wherein the first bias voltage and the second bias voltage are provided by a constant current source.

14. The delay line of claim 13 wherein the constant current source comprises a plurality of zero-gain amplifiers connected in series.

15. The delay line of claim 14 wherein the constant current source further comprises a triple cascode connected to the last zero-gain amplifier of the series of zero-gain amplifiers.

* * * * *